United States Patent [19]

Choi et al.

[11] Patent Number: 5,013,686
[45] Date of Patent: May 7, 1991

[54] METHOD OF MAKING SEMICONDUCTOR DEVICES HAVING OHMIC CONTACT

[75] Inventors: Kyu-Hyun Choi, Seoul; Heyung-Sub Lee, Daejun; Jung-Hwan Lee, Seoul, all of Rep. of Korea

[73] Assignee: SamSung Electronics Co., Ltd., Suwon, Rep. of Korea

[21] Appl. No.: 252,514

[22] Filed: Sep. 30, 1988

[30] Foreign Application Priority Data

Sep. 30, 1987 [KR] Rep. of Korea ............... 87-10932

[51] Int. Cl.[5] ........................................... H01L 21/88
[52] U.S. Cl. .................................... 437/194; 437/47; 437/48; 437/51; 437/60; 437/193; 437/200; 148/DIG. 19; 148/DIG. 147
[58] Field of Search ............... 437/193, 200, 918, 46, 437/47, 48, 56, 57, 60, 51; 357/51, 59; 148/DIG. 19, DIG. 147

[56] References Cited

U.S. PATENT DOCUMENTS

| | | | |
|---|---|---|---|
| 4,128,670 | 12/1978 | Gaensslen | 437/193 |
| 4,388,121 | 6/1983 | Rao | 437/48 |
| 4,398,335 | 8/1983 | Lehrer | 437/193 |
| 4,450,620 | 5/1984 | Fuls et al. | 437/178 |
| 4,519,126 | 5/1985 | Hsu | 148/DIG. 147 |
| 4,555,842 | 12/1985 | Levinstein et al. | 437/200 |
| 4,581,623 | 4/1986 | Wang | 148/DIG. 19 |
| 4,597,153 | 7/1986 | Tsang | 437/200 |
| 4,640,844 | 2/1987 | Neppl et al. | 437/200 |
| 4,703,552 | 11/1987 | Baldi et al. | 437/57 |
| 4,740,479 | 4/1988 | Neppl et al. | 437/193 |
| 4,782,033 | 11/1988 | Gierisch et al. | 437/56 |

FOREIGN PATENT DOCUMENTS

| | | | |
|---|---|---|---|
| 0021400 | 1/1981 | European Pat. Off. | 437/200 |
| 0082458 | 6/1980 | Japan | 437/46 |
| 3131875 | 3/1982 | Japan | 437/193 |
| 0102049 | 6/1982 | Japan | 437/193 |
| 0032446 | 2/1983 | Japan | 437/193 |
| 0147757 | 7/1987 | Japan | 437/918 |
| 2077993 | 12/1981 | United Kingdom | 437/200 |

*Primary Examiner*—Brian E. Hearn
*Assistant Examiner*—Tuan Nguyen
*Attorney, Agent, or Firm*—Robert E. Bushnell

[57] ABSTRACT

A method being capable of achieving the reduction in contact resistance between each layer when bringing a silicide layer into contact with a polycrystalline-silicon (polysilicon) layer in the manufacture of semiconductor devices. The method comprises the steps of forming a polysilicon layer and a silicide layer thereon over a partial top surface of a semiconductor substrate, forming an insulating layer over said silicide layer and the entire top surface of the substrate, forming a contact window by etching the partial area of the insulating layer over said silicide layer, and forming a polysilicon layer over the entire top surface of the substrate after performing ion-implantation through said contact window, wherein said ion-implantation is performed with N-type high doping into the silicide.

15 Claims, 3 Drawing Sheets

5,013,686

METHOD OF MAKING SEMICONDUCTOR DEVICES HAVING OHMIC CONTACT

FIELD OF THE INVENTION

The invention relates to a method of making semiconductor devices and more particularly to a method being capable of achieving a reduction in contact resistance between each layer when bringing a silicide layer into contact with a polycrystalline-silicon (polysilicon) layer in the manufacture of semiconductor devices.

BACKGROUND OF THE INVENTION

The standard cell of static RAM (Static Random Access Memory) being currently used consists of four transistors and two load resistors, and is constituted as shown in FIG. 1. Referring to FIG. 1, it comprises two pairs each of a MOS transistor and high resistor, (R1,T1) and (R2,T2), which are connected in series between a source supply voltage Vcc and a ground voltage Vss, respectively. Each node point 1,2 between the high resistors and the MOS transistors are respectively connected in cross to each gate 3,4 of the opposite one of MOS transistors T2,T1. Other MOS transistors T3,T4 whose gates are connected to a word line WL are interconnected between said node points 1,2 and bit lines BL and BL, respectively. The transistor gates 3,4 used in the static RAM are conventionally made of silicide or the polycide structure in which a silicide is formed on the polycrystalline silicon layer, and the load resistors R1,R2 are made of the polycrystalline silicon.

The prior method of contacting the silicide gate with the polysilicon resistor is as follows. At first, a gate is formed and an insulating layer is deposited over all the surface of the substrate in which the gate is formed. Then a contact window is formed in the insulating layer and a polysilicon layer is deposited thereon, in sequence. However, the ability to achieve the correct ohmic contact therein greatly depends upon the deposition condition of the polysilicon, wherein the failure in achieving such correct ohmic contact often results in the formation of very high resistance more than dozens of kilo-ohms, even though the polysilicon is deposited on a very clean silicide surface in which the insulating layer is completely etched at the process of forming the contact window. When the contact resistance between the silicide and the polysilicon becomes very high, there arises a problem that said contact resistance limits the current which flows through the load resistors R1,R2 from the source supply voltage Vcc. Therefore, it leads to a failure in compensating for leakage current through the transistors T1 to T4, which often results in data error the memory state.

STATEMENT OF THE INVENTION

Accordingly, it is the object of the invention to provide a method of making a semiconductor device having low contact resistance in the contact area between silicide and a polysilicon layer.

This, and other objects, are achieved in a method including the steps of forming a polysilicon layer and silicide layer thereon over a partial top surface of a semiconductor substrate, forming an insulating layer over said silicide layer and the entire top surface of the substrate, forming a contact window by etching the partial area of the insulating layer over said silicide layer, and forming a polysilicon layer over the entire top surface of the substrate after performing ion-implantation through said contact window, wherein said ion-implantation is performed with N-type high doping into the silicide.

BRIEF DESCRIPTION OF THE DRAWINGS

The features and advantages of the method according to the invention will now be explained hereinafter with reference to the accompanying drawings in which.

DETAILED DESCRIPTION OF THE INVENTION

Figure 1:
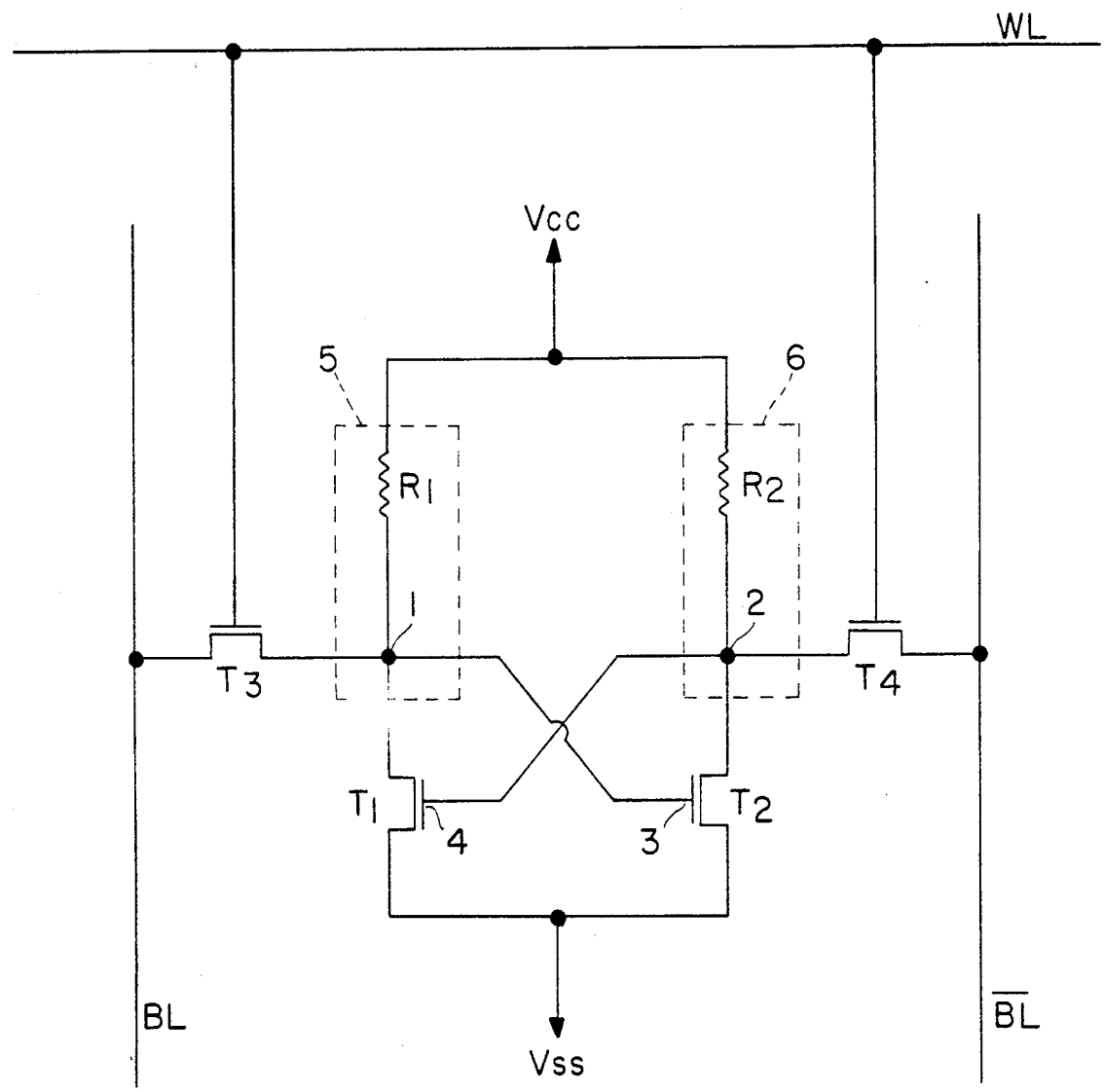
FIG. 1 is an electrically schematic circuit diagram showing the structure of a SRAM.
Figure 2A:
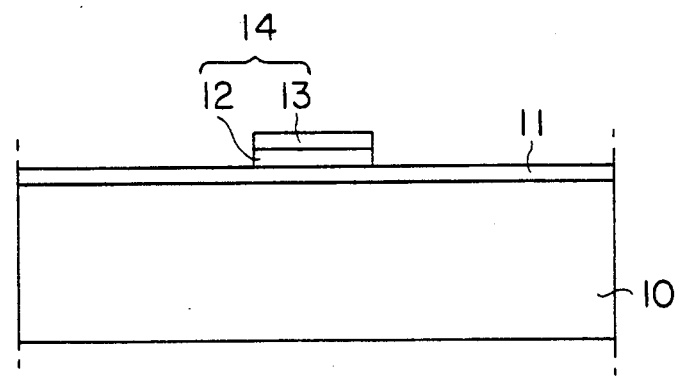
FIGS. 2A to 2D are partial cross-sectional views of each fabrication stage in a preferred embodiment according to the invention.

FIGS. 2A to 2D illustrate each fabrication stage in the contact areas 5,6 between the resistors and the polysilicon in FIG. 1, in which the polycide is used as a transistor gate and the polysilicon as a load resistor. Referring now to FIG. 2A, an oxide layer 11 is formed on a silicon semiconductor substrate 10. Then a phosphorus(P), Arsenic(As) or POCL3 doped polysilicon layer 12 and a silicide layer 13 are coated in sequence for forming a gate on the oxide layer 11. Therefore, a polycide gate 14 consisted of the doped polysilicon layer 12 and the silicide layer 13 is formed by a conventional photolithographic method.

Figure 2B:
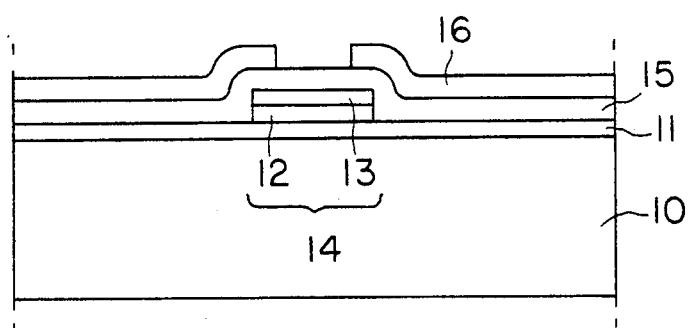
Figure 2C:
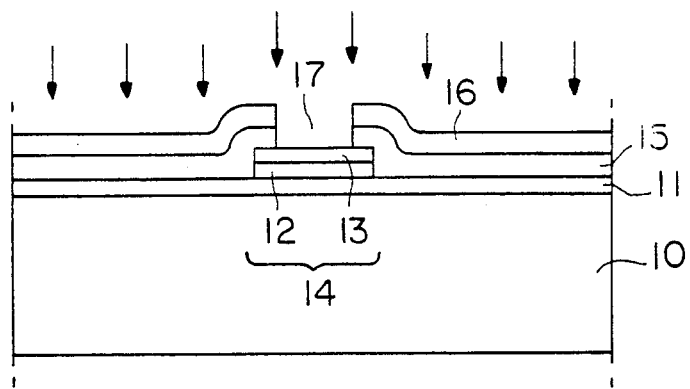
Figure 2D:
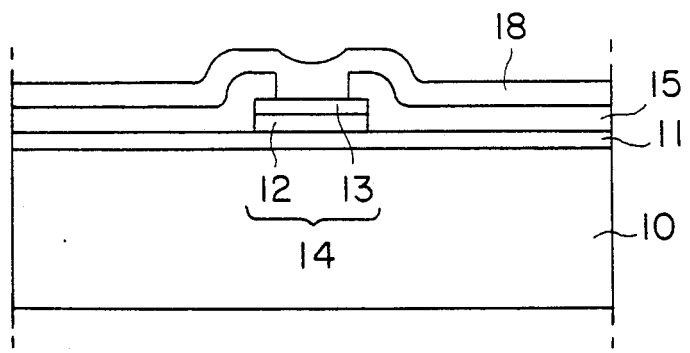

Next in FIG. 2B, an oxide insulating layer 15 is formed over the entire surface of the substrate and the polycide gate 14. To make a pattern to form a contact window, photoresist 16 is coated over the oxide insulating layer 15. After the contact window 17 is formed by a well known etching method, a high dose of ion-implantation is carried out over the entire surface of the substrate with while employing said photoresist as the ion-implantation mask, as shown in FIG. 2C. Therefore, there is carried out the high dose of ion-implantation into the silicide 13 in the contact window. Next, the photoresist 16 is removed and a polysilicon layer 18 is formed thereon to achieve a load resistor portion or element. In the embodiment, the high dose of ion-implantation is preferably carried out only into the silicide portion of the contact window in order to reduce the contact resistance between the polysilicon layer 18 and the polycide gate 14. Ion-implantation may be performed with N-type high doping into the silicide.

Figure 3A:
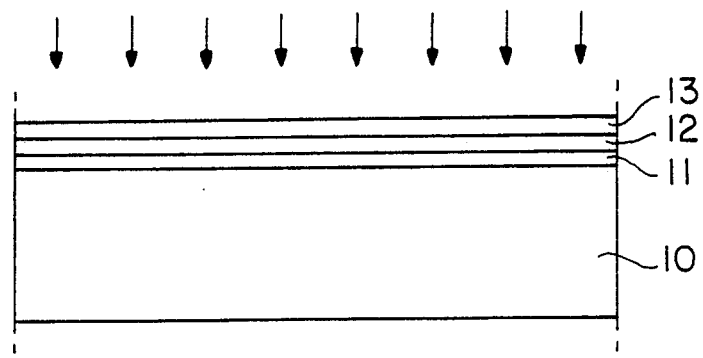
FIGS. 3A to 3C are partial cross-sectional views of each fabrication stage in another embodiment according to the invention.
Figure 3B:
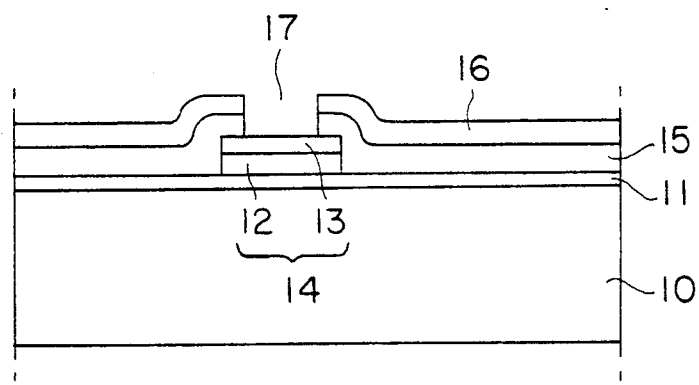
Figure 3C:
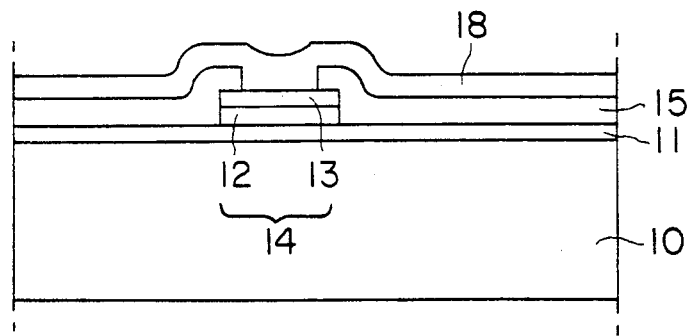

FIGS. 3A to 3C illustrate partial cross-sectional views of each fabrication stage in another embodiment according to the invention, wherein the same reference numerals are used to refer to the same portions or elements as FIGS. 2A to 2D, which embodiment also permits reduction of contact resistance between the polysilicon layer and the polycide gate.

With reference to FIG. 3A, the oxide layer 11 is formed on the semiconductor substrate 10, and the phosphorous doped polysilicon layer 12 and the silicide layer 13 are coated thereon, in sequence, to make a gate on the oxide layer 11. The high dose of ion-implantation is the carried out therein. Referring now to FIG. 3B, the polycide gate 14 is formed by the well known photolithographic method and the oxide insulating layer 15 is grown all over the top surface of the substrate. Coating the photoresist 16 on said insulating layer is followed by forming the contact window 17 achieved by the same photolothographic method. Consequently, the photoresist 16 is removed. Next, as illustrated in FIG. 3C, the polysilicon layer 18 is grown to achieve a load resistor portion or element.

It will be well understood, with reference to the following table A showing each contact resistance in various applications, that the contact resistance in the contact area between the polysilicon and the silicide fabricated through the precesses according to the invention, has much lower value than that of a prior art. In the table, a column A shows each contact resistance in the application of the invention, while another column B shows each contact resistance in the application of a prior art, being respectively derived from a series of tests.

TABLE A

| Test No. | Contact Resistance | |
| --- | --- | --- |
| | A | B |
| 1 | 58.5 Ω | 25 KΩ |
| 2 | 57.5 Ω | 44 KΩ |
| 3 | 58.0 Ω | 21.4 KΩ |
| 4 | 64.8 Ω | 20.4 KΩ |
| 5 | 62.8 Ω | 45 KΩ |
| Total Range | 57.5–64.8 Ω | 20–45 KΩ |

As the aforementioned, the invention can achieve a greatly lowered ohmic contact between a silicide layer and a polysilicon layer in a semiconductor device through forming the polysilicon layer on the silicide layer followed by a high dose ion-implantation, thereby reducing the current loss in the contact area thereof. Moreover, the low contact resistance will lead to reduction a the possibility of data failure which results from the fact that the contact resistance between the silicide gate and the polysilicon load resistor becomes so high that it limits the current flow from the source supply voltage through the load resistors, thereby failing to compensate for leakage current through the transistors.

While the invention has been mainly explained with reference to the preferred embodiment and the contact portion between the silicide of gate and the polysilicon of load resistors in a SRAM, it will be noted that various modifications of the illustrative embodiment will be apparent to those skilled in the art without departing the spirit of the invention. Particularly, the invention will be well employed in every contact area between silicide and polysilicon and not only for fabrication of a SRAM.

What is claimed is:

1. A method of making a semiconductor device having ohmic contact, characterized in that said method comprises the steps of:
   forming a doped polysilicon layer and then forming a silicide layer thereon over a partial top surface of a semiconductor substrate;
   forming an insulating layer over said silicide layer and the entire top surface of the substrate;
   forming a contact window by etching the partial area of the insulating layer over said silicide layer to thereby expose said silicide; and
   forming a polysilicon layer over the entire top surface of the substrate after performing ion-implantation through said contact window.

2. A method according to claim 1, wherein said ion-implantation is performed with N-type high doping into the silicide layer.

3. The method of claim 2, further comprised of performing said ion-implantation only into the silicide layer.

4. The method of claim 1, further comprised of performing said ion-implantation only into the silicide layer.

5. A method of making a semiconductor device having ohmic contact, characterized in that said method comprises the steps of:
   forming a doped polysilicon layer and then forming a silicide layer thereon over the entire top surface of a semi-conductor substrate, and performing ion-implantation thereupon;
   forming an insulating layer over said silicide layer and the entire top surface of the substrate;
   forming a contact window by etching a partial area of the insulting layer; and
   forming a polysilicon layer over the entire top surface of the substrate for making the silicide in contact with the polysilicon layer through said contact window.

6. A method according to claim 5, wherein said ion-implantation is performed with N-type doping into the silicide layer.

7. The method of claim 6, further comprised of performing said ion-implantation only into the silicide layer.

8. The method of claim 5, further comprised of performing said ion-implantation only into the silicide layer.

9. A method for making a semiconductor device, comprising the steps of:
   forming a first polycrystalline silicon layer on one surface of a semiconducting substrate;
   forming a silicide layer upon the first polycrystalline silicon layer;
   subjecting said silicide layer to ion-implantation; and
   forming an ohmic contact by depositing above said silicide layer a second layer of polycrystalline silicon partially lying upon and making electrical contact with a portion of said silicide layer subjected to said ion-implantation.

10. The method of claim 9, further comprised of:
    depositing a layer of an electrically insulating material over said silicide layer and opening a window to said portion of said silicide layer through said layer of insulating material before subjecting said silicide layer to said ion-implantation; and
    depositing said second layer of polycrystalline silicon within said window during said step of forming said ohmic contact.

11. The method of claim 9, further comprised of:
    depositing a layer of an electrically insulating material over said silicide layer and opening a window to said portion of said silicide layer through said layer of insulating material after subjecting said silicide layer to said ion-implantation; and
    depositing said second layer of polycrystalline silicon within said window during said step of forming said ohmic contact.

12. A method for making a semiconductor device, comprising the steps of:
    forming a first polycrystalline silicon layer on one surface of a semiconducting substrate;
    forming a silicide layer upon the first polycrystalline silicon layer;
    depositing a layer of an electrically insulating material over said silicide layer;

depositing a pattern of photoresistive material upon said layer of insulating material;

opening a window to said portion of said silicide layer through said layer of insulating material;

subjecting said silicide layer to ion-implantation by using said photoresistive material as an ion-implantation mask;

removing said photoresistive material; and forming an ohmic contact by depositing above said silicide layer a second layer of polycrystalline silicon partially lying upon and making electrical contact through said window with a portion of said silicide layer subjected to said ion-implantation.

13. The method of claim 12, further comprised of performing said ion-implantation only into the silicide layer.

14. A method for making a semiconductor device, comprising the steps of:

forming a first polycrystalline silicon layer on one surface of a semiconducting substrate;

forming a silicide layer upon the first polycrystalline silicon layer;

subjecting said silicide layer to ion-implantation;

depositing a layer of an electrically insulating material over said silicide layer;

depositing a pattern of a photoresistive material upon said layer of insulating material;

opening a window to a portion of said silicide layer through said layer of insulating material;

removing said photoresistive material; and forming an ohmic contact by depositing above said silicide layer a second layer of polycrystalline silicon partially lying upon and making electrical contact through said window with a portion of said silicide layer subjected to said ion-implantation.

15. The method of claim 14, further comprised of performing said ion-implantation only into the silicide layer.

* * * * *